United States Patent
Shimoda et al.

(10) Patent No.: US 6,362,020 B1
(45) Date of Patent: Mar. 26, 2002

(54) PROCESS OF FORMING DEPOSITED FILM, PROCESS OF PRODUCING SEMICONDUCTOR ELEMENT SUBSTRATE, AND PROCESS OF PRODUCING PHOTOVOLTAIC ELEMENT

(75) Inventors: Hiroshi Shimoda, Kyotanabe; Keishi Saito, Nara, both of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/238,572

(22) Filed: Jan. 28, 1999

(30) Foreign Application Priority Data

Jan. 30, 1998 (JP) .......................................... 10-017608

(51) Int. Cl.[7] .............................................. H01L 21/00
(52) U.S. Cl. ........................................... 438/62; 438/61
(58) Field of Search ..................... 438/61, 62; 136/244, 136/249, 251, 258; 361/225

(56) References Cited

U.S. PATENT DOCUMENTS

| 4,485,125 A | 11/1984 | Izu et al. ....................... 427/74 |
| 4,788,846 A | * 12/1988 | Morita et al. .................. 72/160 |
| 5,281,541 A | 1/1994 | Saito et al. ..................... 437/2 |
| 5,418,680 A | 5/1995 | Saito et al. .................. 361/225 |
| 5,727,367 A | * 3/1998 | Cahill et al. ................... 53/462 |
| 5,975,745 A | * 11/1999 | Oishi et al. ............. 364/474.09 |

FOREIGN PATENT DOCUMENTS

| JP | 354031480 A | * 3/1979 | |
| JP | 3-30419 | 2/1991 | ......... H01L/21/205 |
| JP | 403101171 A | * 4/1991 | |
| JP | 405269697 A | * 10/1993 | |
| JP | 6-184745 | 7/1994 | ........... C23C/14/56 |

\* cited by examiner

*Primary Examiner*—John F. Niebling
*Assistant Examiner*—Viktor Simkovic
(74) *Attorney, Agent, or Firm*—Fitzpatrick, Cella, Harper & Scinto

(57) ABSTRACT

The present invention provides a process of forming a deposited film on a belt-like substrate by a roll-to-roll system, the process comprising the step of eliminating a curl deformation of the belt-like substrate resulting from application of a deformation stress, by exerting an external stress on a non-depositing surface of the belt-like substrate. It can prevent occurrence of flaws, defects of appearance, defects of electrode, and so on in succeeding steps etc. and can produce semiconductor elements and photovoltaic elements with high quality at a high yield.

32 Claims, 8 Drawing Sheets

PROCESS OF FORMING DEPOSITED FILM, PROCESS OF PRODUCING SEMICONDUCTOR ELEMENT SUBSTRATE, AND PROCESS OF PRODUCING PHOTOVOLTAIC ELEMENT

BACKGROUND OF THE INVENTION

1. Field of the Invention

The present invention relates to a process of forming a deposited film, a process of producing a semiconductor element substrate, and a process of producing a photovoltaic element. More particularly, the invention concerns a process of producing a semiconductor element such as a photovoltaic element or the like without curl deformation by incorporating a step of eliminating curl deformation.

2. Related Background Art

In recent years various research and development has been conducted toward practical use of solar power generation with solar cells (photovoltaic elements). In order to adapt the solar cells to the demand for power, there are such requirements that the solar cells used have sufficiently high photoelectric conversion efficiency and excellent reliability and that they can be manufactured in volume.

Amorphous silicon (hereinafter referred to as "a-Si") solar cells are drawing attention, because they can be produced at a low cost and have high volume productivity, as compared with the solar cells made using crystalline Si or the like. The reason is that readily available gas such as silane or the like is used as a source gas and it is decomposed by a glow discharge whereby a deposited film such as a semiconductor film or the like can be formed on a relatively inexpensive belt-like substrate such as a metal sheet, a resin sheet, or the like. There are various suggestions as to processes and apparatus for producing the a-Si solar cells.

FIG. 1 is an example of a schematic sectional view of a single type a-Si solar cell. In FIG. 1, reference numeral 101 designates a substrate, 102 and 103 a back surface reflecting layer (102 denotes a metal layer and 103 a transparent oxide layer), 104 to 106 semiconductor layers (104 is an n-type semiconductor layer, 105 an i-type semiconductor layer, and 106 a p-type semiconductor layer), 107 a transparent conductor layer, and 108 a collector electrode. The part 101 to 107 will be called a solar cell slab (hereinafter referred to as "slab") for convenience—sake.

For producing the a-Si solar cell, an electroconductive belt-like substrate of stainless steel or the like rolled in a roll form is preferably used as the substrate 101; as to the back surface reflecting layer 102, 103, silver, aluminum, copper, and so on with high reflectance are preferably used for the metal layer 102 and transparent oxides with moderate resistance, including zinc oxide, tin oxide, and so on, are preferably used for the transparent oxide layer 103. These are deposited by a continuous sputter apparatus of the roll-to-roll system as also disclosed in Japanese Patent Application Laid-Open No. 6-184745, etc.

As a film forming production apparatus of semiconductor layers, U.S. Pat. No. 4,485,125 discloses a continuous plasma CVD apparatus of the roll-to-roll system. In the apparatus, the n-type semiconductor layer 104 and the p-type semiconductor layer 106 are formed by RF plasma CVD and the i-type semiconductor layer 105 by RF plasma CVD or by microwave ($\mu$w) plasma CVD disclosed in Japanese Laid-open Patent Application No. 3-30419. Since the microwave has a high frequency, the energy density can be made higher than in the case of RF and it is thus suitable for efficient generation of a plasma at a low pressure and maintenance thereof. It is known that the microwave prevents polymerization of active species, which is the cause of degrading characteristics of a deposited film, to obtain the deposited film with high quality, suppresses evolution of powder of polysilane or the like in the plasma, and achieves drastic increase of the deposition rate.

The transparent conductor layer 107 is preferably formed by use of $SnO_2$, $In_2O_3$, ITO ($In_2O_3+SnO_2$) films, and so on having excellent characteristics including transparency to visible light and electric conductivity, and is formed by the continuous sputter apparatus of the roll-to-roll system.

The collector electrode 108 is formed, for example, in such a manner that after formation of the transparent conductor layer 107, a slab of a desired size is cut out of the roll and wires of copper, silver, or the like are attached thereto through a line of solar cell module steps.

For volume production of the solar cells by the roll-to-roll system, the belt-like substrate is lengthened and widened; for further reduction of cost, it is desired to decrease the thickness of the substrate.

However, the lengthening and widening of the substrate poses the problem that during formation of each deposited film, particularly, during formation of the back surface reflecting layer and semiconductor layers, the substrate is thermally deformed to curl because of the heat from a heater and the plasma. With decrease in the thickness of the substrate, there arises the problem that the substrate is subject to deposited membrane stress of each deposited film, to become easier to curl. Such problems arise more or less in forming a deposited film by the roll-to-roll system, without being limited to the solar cells.

The curl deformation of the substrate poses problems of occurrence of flaws, defects of the collector electrode, and so on and thus possibly degrades the yield and appearance of the solar cells considerably, in succeeding steps to formation of the transparent conductor layer, specifically, in steps for formation of the solar cell module, including the slab cutting step, the collector electrode forming step by attachment of wires, and so on. These problems may also arise similarly in production of the other elements than the solar cells; for example, in production of elements including semiconductor elements such as sensors or the like, liquid crystal elements (also including elements that cannot be mentioned as semiconductor elements), and so on.

SUMMARY OF THE INVENTION

An object of the present invention is, therefore, to form the semiconductor elements, particularly photovoltaic elements, with excellent appearance at a good yield, solving the problems as stated above.

According to one aspect of the present invention, there is provided a process of forming a deposited film on a belt-like substrate by a roll-to-roll system, the process comprising the step of eliminating a curl deformation of the belt-like substrate resulting from application of a deformation stress, by exerting an external stress on a non-deposition surface of the belt-like substrate.

According to another aspect of the present invention, there is provided a process of producing a semiconductor element substrate, comprising the step of depositing at least a semiconductor layer on a belt-like substrate by a roll-to-roll system, the process further comprising the step of eliminating a curl deformation of the belt-like substrate resulting from application of a deformation stress, by exerting an external stress on a non-deposition surface of the belt-like substrate.

According to yet another aspect of the present invention, there is provided a process of producing a photovoltaic element, comprising the step of depositing at least a semiconductor layer and a transparent conductor layer on a belt-like substrate by a roll-to-roll system, the process further comprising the step of eliminating a curl deformation of the belt-like substrate resulting from application of a deformation stress, by exerting an external stress on a non-deposition surface of the belt-like substrate.

The deformation stress includes thermal deformation stress in formation of a deposited film such as a semiconductor layer, a transparent conductor layer, or a back surface reflecting layer, and internal stress of the deposited film.

The belt-like substrate is preferably an electrically conductive substrate.

The external stress is preferably a deformation stress to effect plastic deformation of the belt-like substrate. The external stress is preferably exerted by use of a curl corrector, and the curl corrector is preferably a cylindrical roller type curl corrector. The external stress is preferably exerted after formation of the deposited film such as the transparent conductor layer, the semiconductor layer, or the back surface reflecting layer.

The present invention can solve the problems including the occurrence of flaws, the defects of the collector electrode, etc. in the succeeding steps including the slab cutting step, the step of forming the collector electrode by attachment of wires, and so on, by incorporating the step of eliminating the curl deformation generated in the belt-like substrate, by exerting the external stress to effect plastic deformation to the non-deposition surface.

DESCRIPTION OF THE PREFERRED EMBODIMENTS

First described are specific examples of the curl deformation of the belt-like substrate. For example, while the photovoltaic element is formed by successively stacking the back surface reflecting layer, semiconductor layers, and transparent conductor layer on the electroconductive belt-like substrate by the roll-to-roll system, the electroconductive belt-like substrate is subject to deformation stresses, including a thermal deformation stress by the heater and plasma during formation of each deposited film, a membrane stress of each deposited film, an external stress from a steering mechanism of the roll-to-roll film forming apparatus, and so on. Each of the stresses will be explained below.

Thermal Deformation Stress

Figure 2:
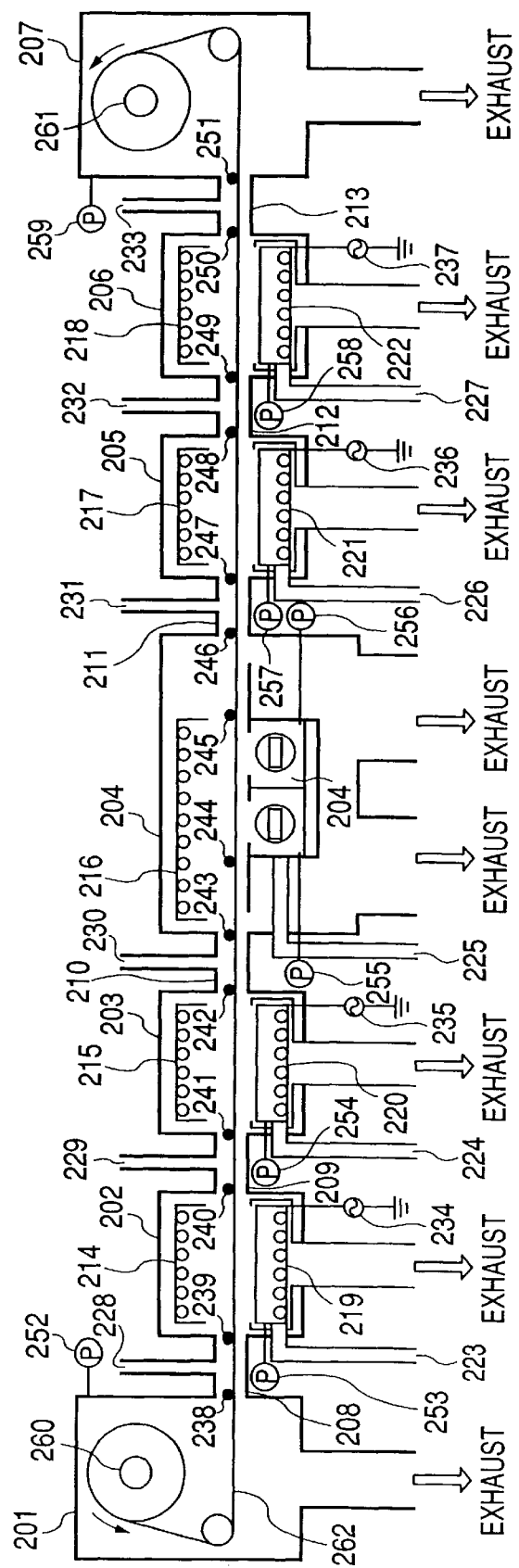
FIG. 2 is a schematic sectional view showing an example of a continuous plasma CVD apparatus of the roll-to-roll system.

Description will be given with an example of steps of depositing the nip type semiconductor layers, using the continuous plasma CVD apparatus of the roll-to-roll system and using an SUS4302D substrate having the width of 356 mm and the thickness of 0.15 mm, under the tension 70 kg in the carrying direction and at the carrying speed of 635 mm/min. FIG. 2 is a schematic view of the apparatus. In FIG. 2, numeral 201 denotes a substrate feed chamber, 202 an RF chamber for formation of the n-type semiconductor layer, 203 an RF chamber for formation of the i-type semiconductor layer, 204 a μw chamber for formation of the i-type semiconductor layer, 205 an RF chamber for formation of the i-type semiconductor layer, 206 an RF chamber for formation of the p-type semiconductor layer, 207 a substrate winding chamber, 208 to 213 gas gates, 214 to 218 lamp heaters, 219 to 222 gas heaters, 223 to 233 gas inlet pipes, 234 to 237 high-frequency oscillators, 238 to 251 carrying rollers, 252 to 259 vacuum gages, 260 a substrate feed bobbin, 261 a substrate winding bobbin, and 262 the substrate.

When the substrate 262 is carried to immediately above a discharge space of the chamber 202 to 206 for formation of each semiconductor layer, it is heated from the back of its film-forming surface by the lamp heater 214 to 218, while the film-forming surface is heated by the plasma to a high temperature. After leaving the discharge space, the substrate heated in the discharge space is cooled through the gas gate 209 to 213 to lower the temperature. Therefore, there exists the temperature difference in the direction of carrying the substrate 262 and such heating and cooling is repeated through the plurality of discharge spaces.

In general, the high-temperature sections will have a wider width of the substrate because of thermal expansion than the low-temperature sections. It is noted here that the thermal expansion in the substrate thickness direction is negligible. A thermal expansion amount in the carrying direction is also as small as negligible, as compared with the long carrying path. The thermal expansion amount in the widthwise direction, however, is too large to neglect and this is the main cause of deformation.

Figure 3:
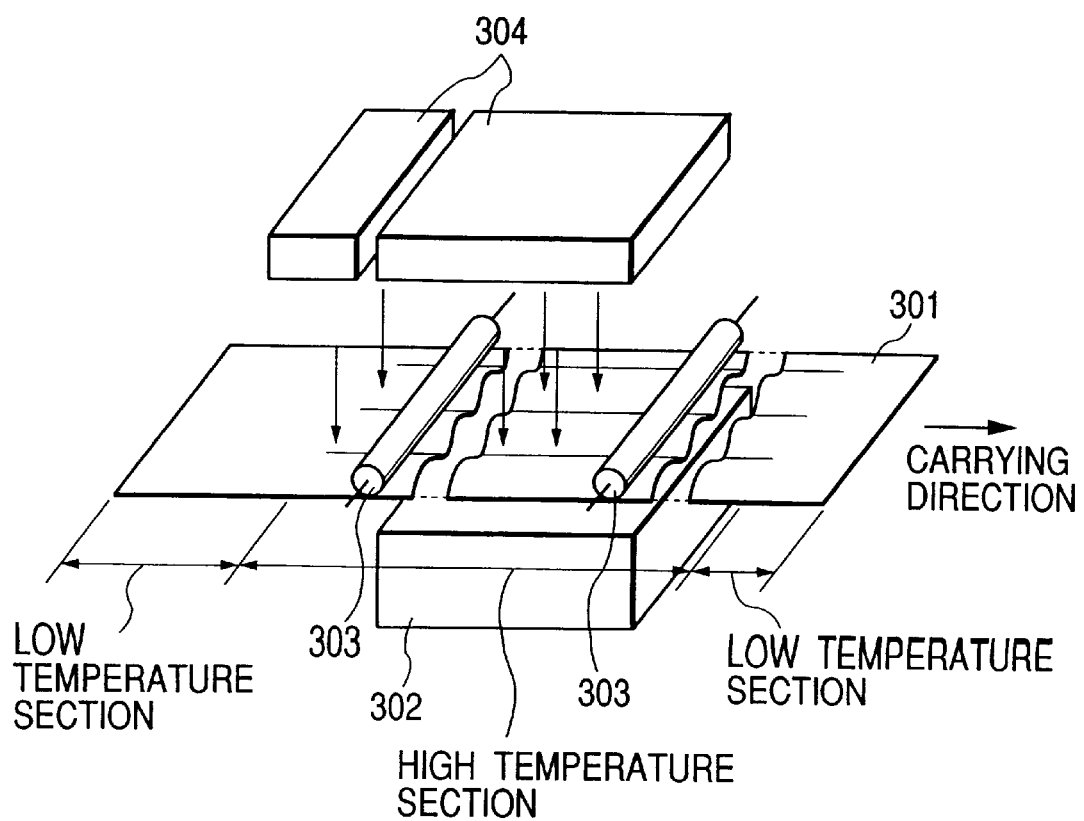
FIG. 3 is a schematic conceptual view (perspective view) showing a substrate having continuous high-temperature and low-temperature sections, for explaining deformation due to thermal stress of the substrate.

FIG. 3 is a schematic conceptual view (perspective view) which shows the continuous high-temperature and low-temperature sections of the substrate. In FIG. 3, numeral 301 designates the substrate, 302 a discharge box, 303 magnet rollers being carrying rollers, and 304 lamp heaters.

Considering the difference in expansion amounts of the substrate according to locations, a model can be applied in which substrates of different widths are linked. Further, the apparent width of the substrate is resistant to change, because the tension is exerted in the carrying direction of the substrate. Therefore, compressive force acts toward the center of the substrate in the high-temperature sections so that the substrate width of the high-temperature sections thermally expanded comes to be matched with the substrate width of the low-temperature sections.

It is generally known that when a compressive force or tensile force acts on a thin plate, the thin plate is easy to be distorted in the direction normal to the surface thereof. Since the substrate herein is also very thin, 0.15 mm, the substrate is deformed in the direction normal to the surface of the substrate by the aforementioned compressive force.

Figure 4:
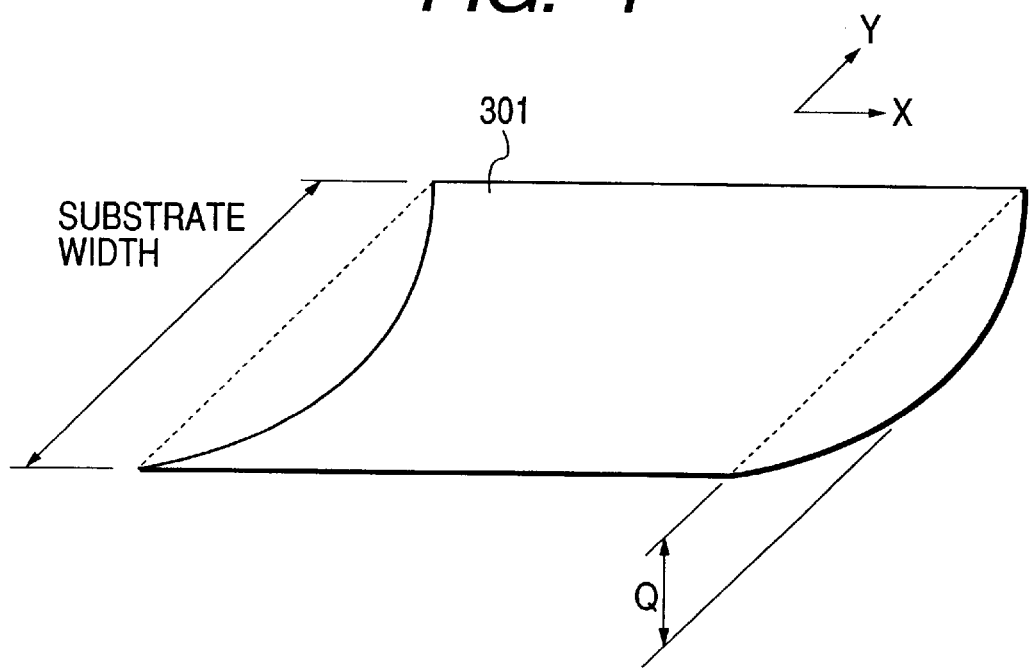
FIG. 4 is a partial, perspective view of a curled substrate.

FIG. 4 is a partial perspective view of the curled substrate. The substrate 301 has the width of 356 mm at room temperature (25° C.), the carrying direction is defined as X, and the width direction as Y. The dashed lines in the figure represent the flat shape of the substrate at 25° C.

Table 1 shows thermal expansion amounts in the width direction of the substrate at typical film-forming temperatures and computed amounts of strain appearing thereat. The strain amounts Q in the table are distances from a peak surface of an arc to the flat surface under the assumption that the substrate thermally expanded is deformed into the arc shape when corrected into the width 356 mm.

TABLE 1

| Substrate temperature (° C.) | Width of substrate (mm) | Thermal expansion amount in width direction (mm) | Strain amount Q (mm) |
| --- | --- | --- | --- |
| 25 | 356 | 0 | 0 |
| 200 | 356.14 | 0.14 | 4 |
| 300 | 356.21 | 0.21 | 6 |

<Deposited membrane stress>

Figure 5A:
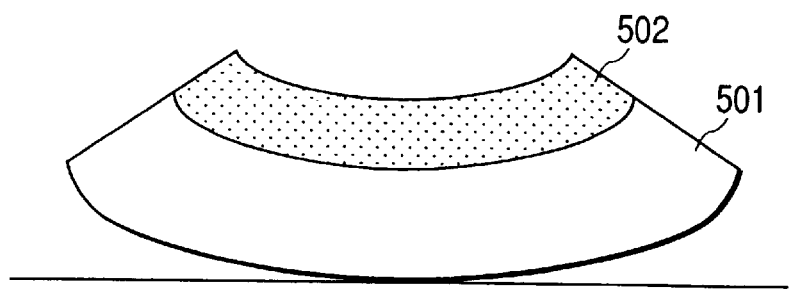
FIGS. 5A and 5B are schematic views showing examples of curl deformation due to deposited membrane stress in the present invention.
Figure 5B:
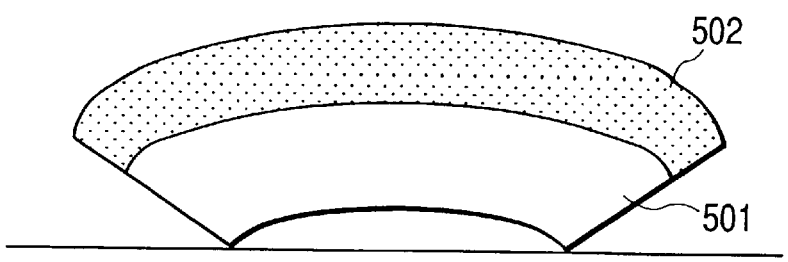

When a film is deposited on a thin substrate, a curl deformation due to deposited membrane stress occurs in the substrate. In the present specification and claims, the following definitions are adopted; when the substrate is curled with the film inside, a tensile stress exists in the film; when the substrate is curled with the film outside, conversely, a compressive stress exists in the film. FIGS. 5A and 5B are schematic views showing examples of the curl deformation due to the deposited membrane stress. In the figures numeral 501 designates the substrate and 502 the deposited film. FIG. 5A shows an example in which the tensile stress exists, and FIG. 5B an example in which the compressive stress exists.

While the tensile stress is acting in the film, the substrate immediately below the interface with the film is in a compressed state; conversely, while the compressive stress is acting in the film, the substrate is in a tensile state.

Next, the deposited membrane stress will be described in detail under classification of thermal stress and internal stress.

(Thermal stress)

Since the substrate and the deposited film have different coefficients of thermal expansion, there appears the thermal stress due to the temperature difference between during formation of the film and at ordinary temperature, in the film. Further, when the coefficient of thermal expansion of the film is greater than that of the substrate, contribution of the stress due to the difference between the coefficients of thermal expansion increases. Moreover, the thermal stress increases as the substrate temperature becomes higher during formation of the film.

(Internal stress)

The internal stress is a stress still remaining even after elimination of the thermal stress, and the internal stress varies large, depending upon film-forming means and film-forming conditions. The internal stress is caused by a strain appearing because of formation of the film per se.

Figure 1:
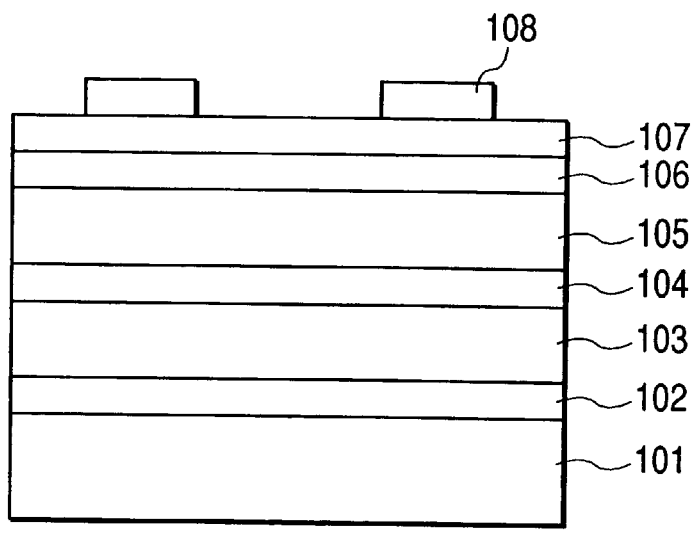
FIG. 1 is a schematic side view showing an example of the structure of a single type a-Si solar cell.

Here is described the internal stress on the substrate due to the back surface reflecting layer, which is the first deposited layer in the present invention. The back surface reflecting layer of 102, 103, exemplified in FIG. 1, is comprised of the metal layer 102 with a high reflectance and the transparent oxide layer 103 with a moderate resistance, as described previously, and these are formed by the continuous sputter apparatus or the like of the roll-to-roll system. As the sputtering system is employed the DC magnetron sputtering or the like in which a DC voltage is applied to target members of metal and metal oxide to bombard the target members with Ar ions or the like, thereby depositing sputter particles on the substrate.

It is considered that in the film formation by sputtering, Ar atoms and sputter atoms with high energy fly onto the substrate to bombard the substrate during the formation of film, whereby the sputter film is formed with the internal stress therein. Further, lowering of the sputter pressure will result in increasing the mean free path of particles existing in the system and thus increasing the number of Ar atoms and sputter atoms with high energy among the particles reaching the substrate, thereby increasing the internal stress. Moreover, the internal stress increases as the thickness of film increases.

As an example, Al was deposited 0.2 μm and ZnO 1.2 μm, as the back surface reflecting layer, on the SUS4302D substrate having the width of 356 mm and the thickness of 0.15 mm, using the continuous DC magnetron sputtering apparatus of the roll-to-roll system (not shown). After the film formation, the substrate with the back surface reflecting layer deposited thereon was visually observed at ordinary temperature and it was found that the substrate was curled with the film outside as illustrated in FIG. 5B, and therefore that the compressive stress existed as the internal stress in the film.

[External Stress]

Figure 6:
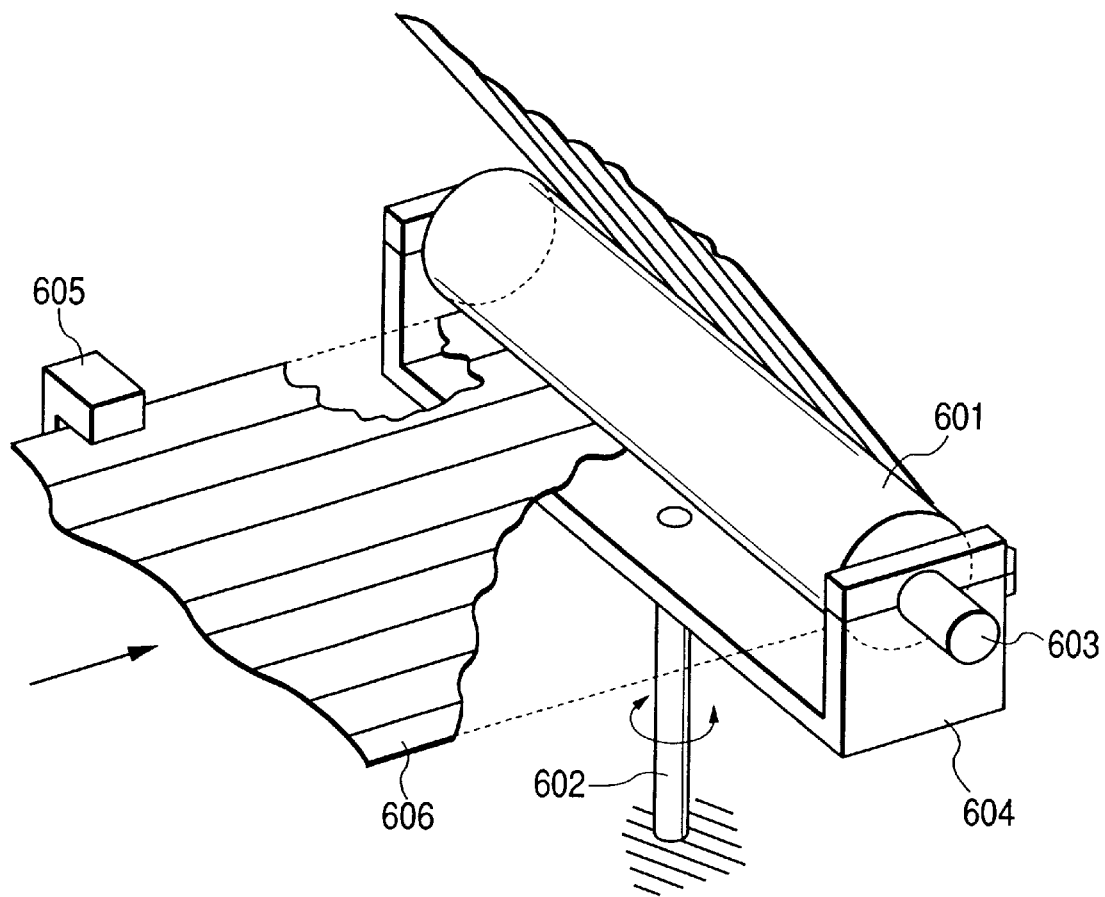
FIG. 6 is a schematic perspective view showing a steering mechanism in the film forming apparatus of the roll-to-roll system.

The film forming apparatus of the roll-to-roll system for forming the back surface reflecting layer, semiconductor layers, and transparent conductor layer is provided with a steering mechanism illustrated in FIG. 6, as a mechanism for aligning the end face of the substrate during winding. In FIG. 6, numeral 601 designates a steering roller, 602 a rotating mechanism, 603 an encoder for detecting the carrying speed, 604 a bearing, 605 a mechanism for detecting a horizontal shift of the substrate, and 606 the substrate. There appears the difference of tension in the width direction of the substrate between during operation and during quiescent operation of the steering mechanism and repetition of operation and quiescent operation affects the deformation of the substrate. Further, external force to curl the substrate with the deposited films outside acts on the substrate, because the substrate is wound up onto a substrate winding bobbin after passing the steering roller with the surface of the deposited films outside.

The present invention is the process of forming the deposited film, adapted so that when the belt-like substrate is subject to the deformation stress including the thermal deformation stress, the deposited membrane stress, the external stress, and so on, as described above, to experience curl deformation, the curl deformation is eliminated by exerting an external stress to effect plastic deformation thereof, on the non-film-forming surface of the belt-like substrate, so as to prevent occurrence of flaws, defects of the collector electrode, and so on in the succeeding steps, thereby forming the photovoltaic elements etc. with good appearance at a high yield.

Figure 7:
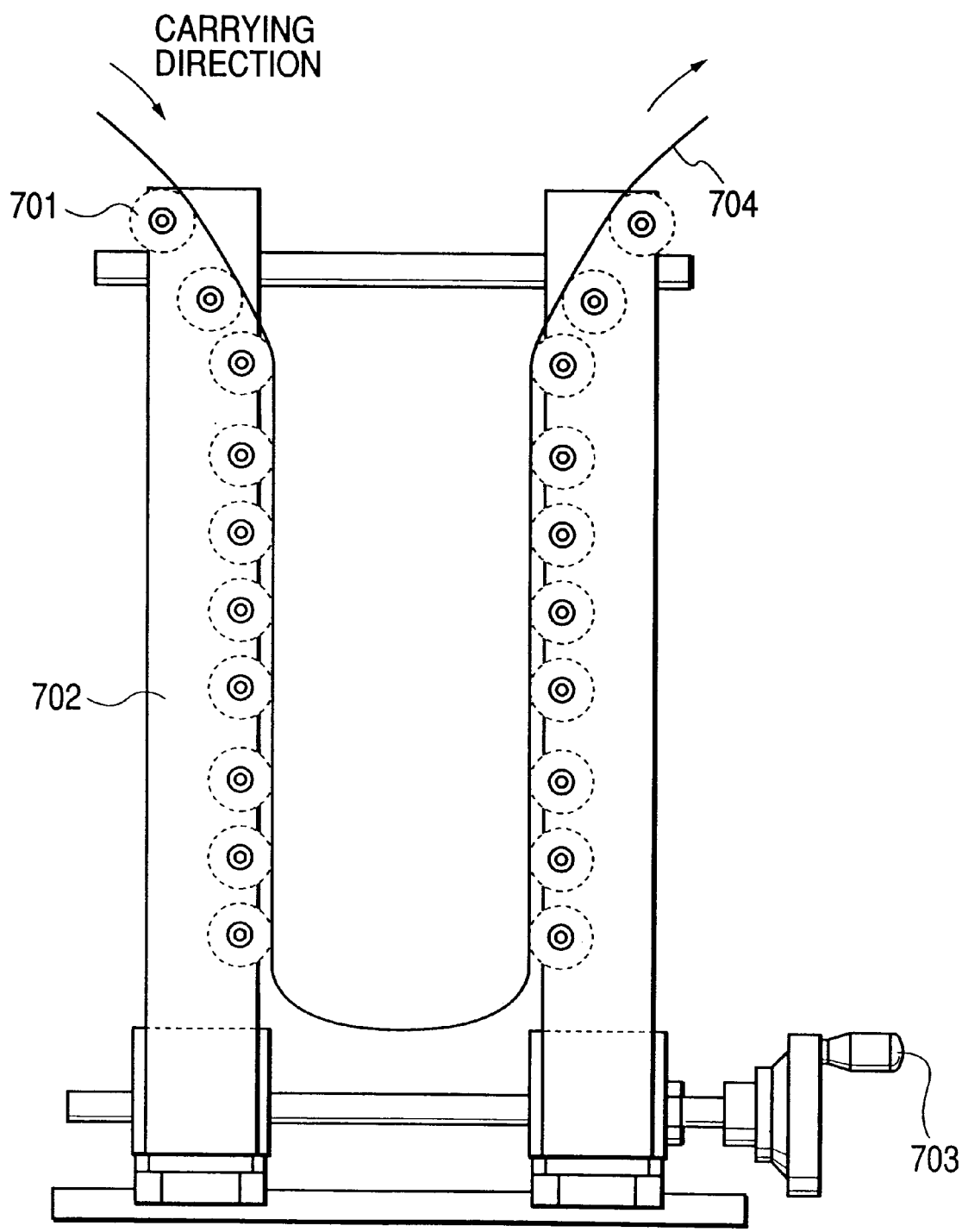
FIG. 7 is a schematic sectional view showing an example of a cylindrical roller type curl corrector used in the present invention.

In the present invention, a curl corrector, particularly, a cylindrical roller type curl corrector, is preferably used as the above curl deformation eliminating means. FIG. 7 is a schematic sectional view which shows an example of the cylindrical roller type curl corrector. In the figure, numeral 701 designates cylindrical rollers, 702 a frame, 703 a handle for adjusting a distance between faced rollers, and 704 the substrate. There are cylindrical rollers 701 opposed on either side, ten rollers being vertically aligned on each side, and the opposed distance can be adjusted by the handle 703 for adjusting the distance between the opposed rollers. The length of the cylindrical rollers has to be at least longer than the width of the substrate.

When the curled substrate 704 after formation of the deposited layers is guided through the corrector of FIG. 7, the twenty cylindrical rollers 701 and the weight of the substrate 704 itself causes each roller to exert the external stress to effect the plastic deformation, on the non-film-forming surface of the substrate 704, thereby eliminating the curl deformation.

In the production of the photovoltaic element described above, the curl deformation eliminating step is preferably carried out after formation of either of the back surface reflecting layer, the semiconductor layers, and the transparent conductor layer.

An example of the photovoltaic element formed by the forming process of the present invention is one obtained by depositing the back surface reflecting layer comprised of the metal layer of aluminum with a high reflectance and the transparent oxide layer of zinc oxide with moderate resistance and transparency on the belt-like substrate of stainless steel, depositing triple type semiconductor layers having three pin junctions the i-type semiconductor layers of which are comprised of a-Si, a-SiGe, and a-SiGe, respectively on the back surface reflecting layer, and further depositing ITO with moderate resistance and transparency on the semiconductor layers.

EXAMPLES

Example 1

Figure 8:
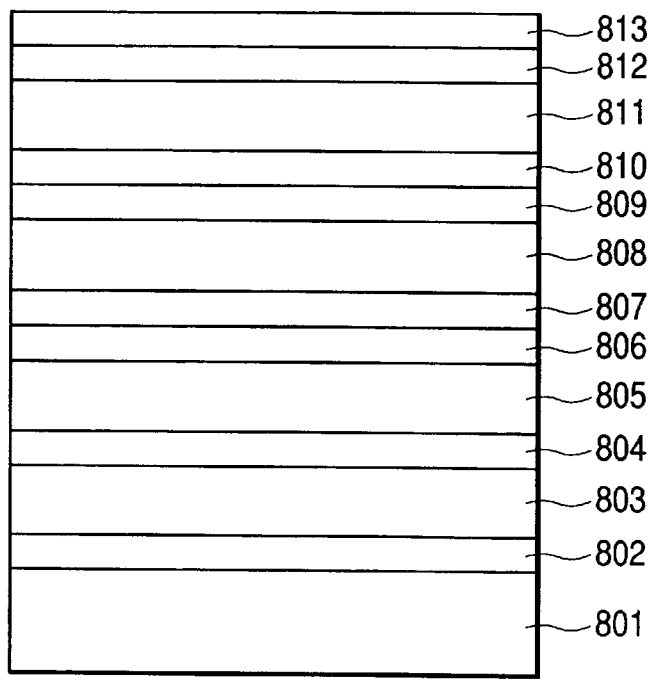
FIG. 8 is a schematic side view showing a triple type a-Si solar cell slab prepared in an example of the present invention.

As a first example of the present invention, a triple type a-Si solar cell slab of the structure illustrated in FIG. 8 was made, the slab was then cut in a desired size, and the collector electrode was made by attachment of wires by the solar cell module line, thereby making a thin film solar cell. In FIG. 8, numeral 801 designates the substrate, 802 and 803 the back surface reflecting layer, 804 to 812 the semiconductor layers, and 813 the transparent conductor layer.
(Step 1)

After degreased and cleaned sufficiently with OAKITE (trade name of a strong alkali cleaning agent of pH 12: KOH diluted with pure water (23±1% by volume)) and with pure water, the belt-like substrate of stainless steel (356 mm wide, 0.15 mm thick, and 750 m long) 801 was set in the roll-to-roll type DC magnetron sputter apparatus (not shown), Al was deposited in the thickness of 0.2 $\mu$m, and thereafter ZnO was deposited in the thickness of 1.2 $\mu$m, thereby forming the back surface reflecting layer 802, 803.
(Step 2)

Then the substrate was taken out and was then set in a triple type apparatus modified from the roll-to-roll type plasma CVD apparatus illustrated in FIG. 2. Then successively stacked on the back surface reflecting layer 803 were an n-type layer 804 comprised of a-Si, an i-type layer 805 comprised of a-SiGe, a p-type layer 806 comprised of $\mu$c-Si (microcrystalline silicon) (these three layers composing a bottom layer), an n-type layer 807 comprised of a-Si, an i-type layer 808 comprised of a-SiGe, a p-type layer 809 comprised of $\mu$c-Si (these three layers composing a middle layer), an n-type layer 810 comprised of a-Si, an i-type layer 811 comprised of a-Si, and a p-type layer 812 comprised of $\mu$c-Si (these three layers composing a top layer). The i-type layers 805, 808 of the bottom layer and the middle layer were formed by the $\mu$w plasma CVD process and the other layers by the RF plasma CVD process. Therefore, the semiconductor layers composed triple cells. The thickness of the i-type layer 805 was 900 Å, the thickness of the i-type layer 808 was 850 Å, and the thickness of the i-type layer 811 was 950 Å.
(Step 3)

The substrate was taken out and then was set in the roll-to-roll type DC magnetron sputtering apparatus (not shown). Then ITO was deposited in the thickness of 850 Å on the semiconductor layers, thereby forming the transparent conductor layer 813.

The steps heretofore had completed the production of the triple type solar cell slab having three pin junctions whose i-type semiconductor layers were of a-Si, a-SiGe, and a-SiGe, respectively.
(Step 4)

The substrate was taken out and was made to pass through the cylindrical roller type curl corrector illustrated in FIG. 7 to eliminate the curl deformation. The cylindrical rollers were those having the diameter of 38 mm and the length of 707 mm and the distance between the opposed rollers was 130 mm.
(Step 5)

Figure 9:
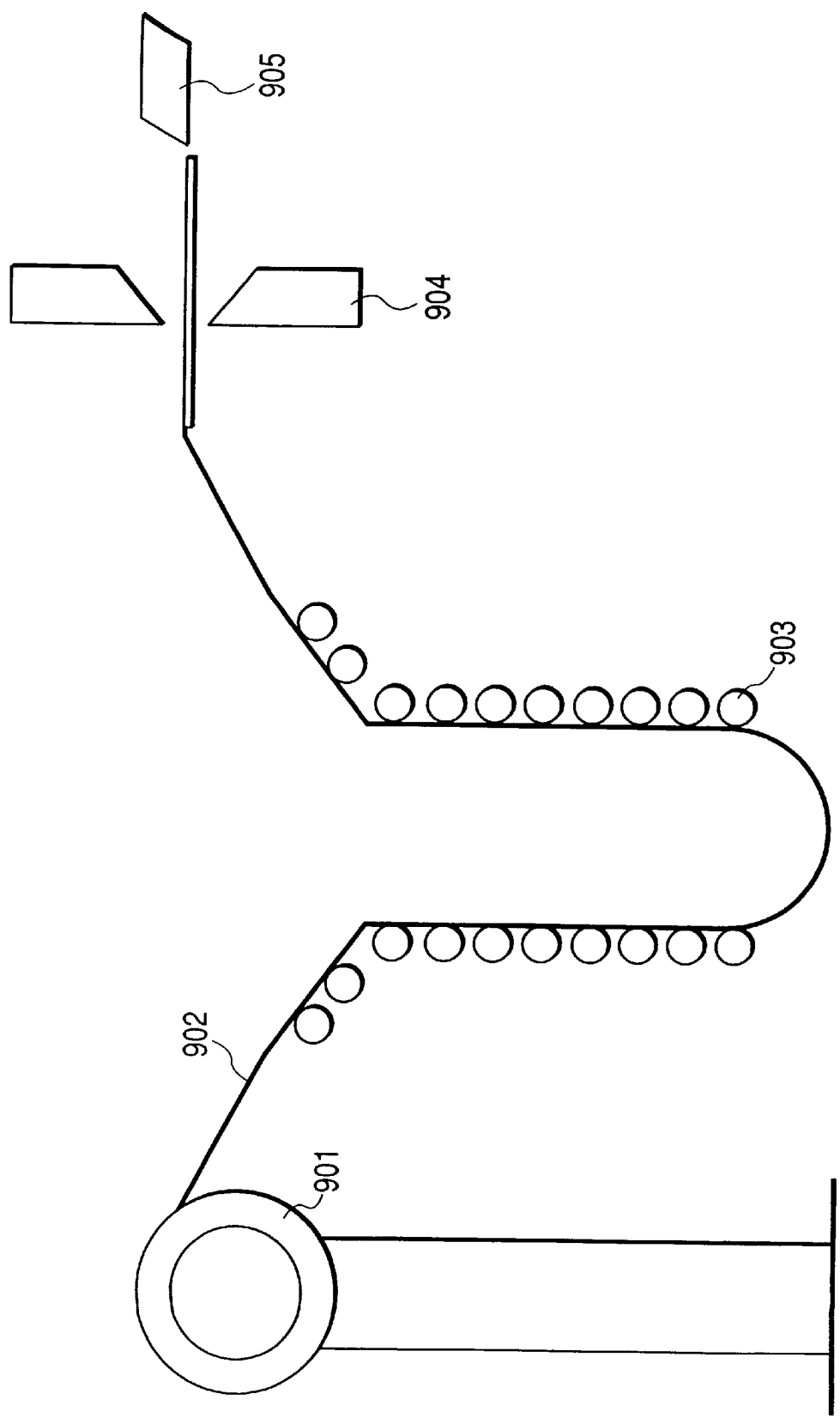
FIG. 9 is a schematic sectional view showing curl deformation elimination and slab cutting steps in an examples of the present invention.

Subsequent to step 4, the slab was cut in the size of 356 mm×240 mm (specifically, in the size of 240 mm in the substrate carrying direction with keeping the width 356 mm) by a slab cutter 904, as illustrated in FIG. 9. In the figure, numeral 901 designates a bobbin, 902 the substrate, 903 the cylindrical rollers, similar to 701 shown in FIG. 7, 904 the slab cutter, and 905 a slab after cut.

Figure 10:
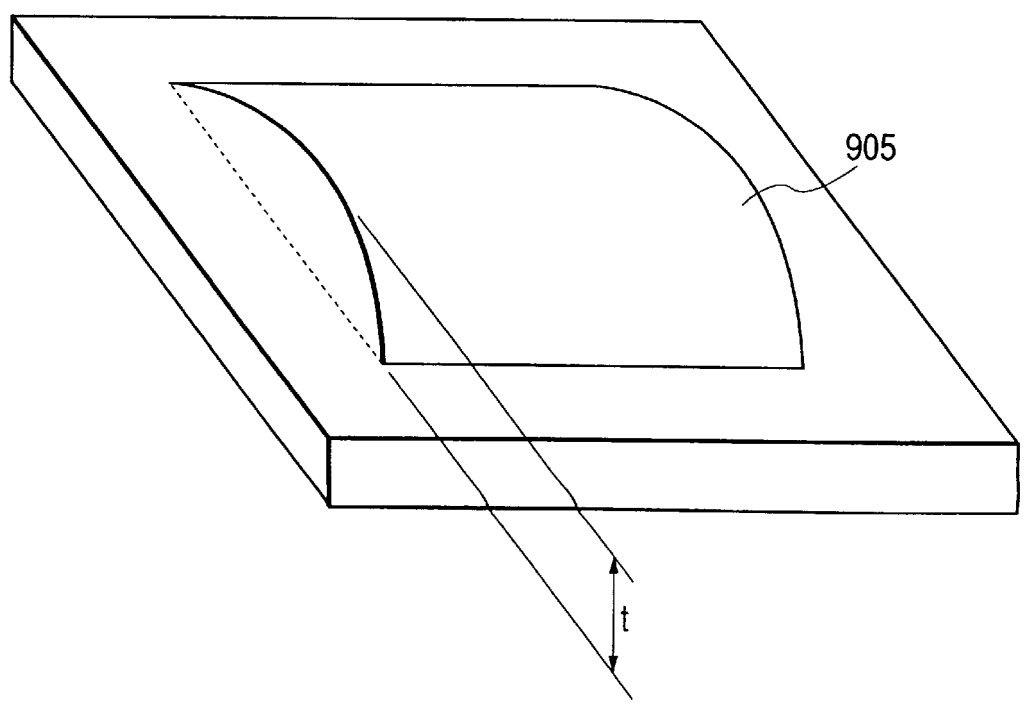
FIG. 10 is a schematic perspective view showing a method of measuring a curl deformation amount.

After that, an arbitrary slab thus cut was sampled and a curl amount t thereof was measured while the slab was placed on a horizontal stage with the film-formed surface up, as illustrated in FIG. 10.
(Step 6)

Figure 11:
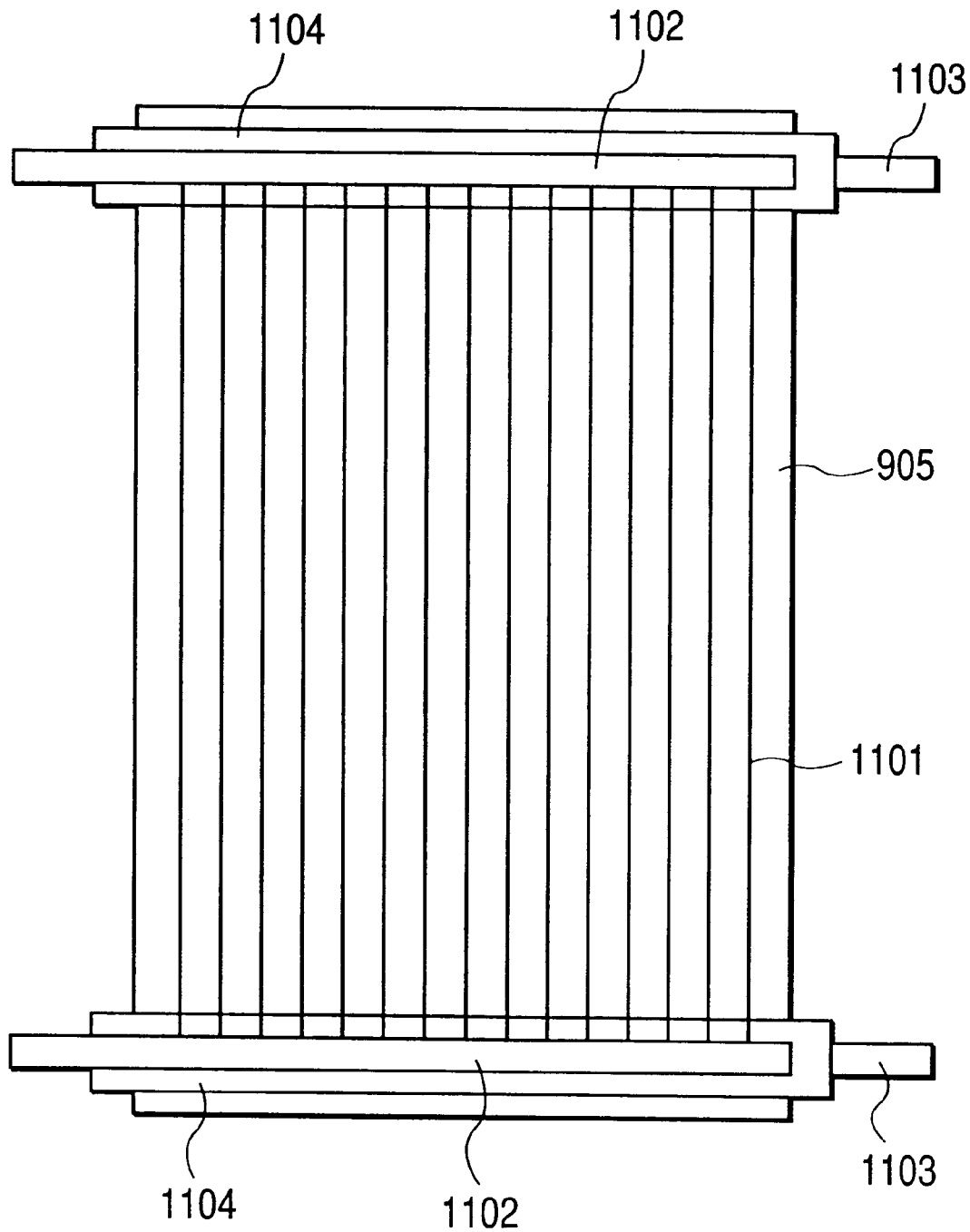
FIG. 11 is a schematic plan view of a solar cell prepared in an example of the present invention, when observed from the light incidence side.

The cut slab 905 was made to run in the solar cell module line (not shown) to be subjected to the module processing including an electrolytic etching process and the like. Then, as illustrated in FIG. 11, two sided adhesive tapes 1104 were attached to the slab, thereafter the collector electrode 1101 was made by attaching forty two wires at the pitch of 5.6 mm, and tabs 1102 for the positive electrode and tabs 1103 for the negative electrode were attached.

The thus obtained thin film solar cell was evaluated by checking the appearance thereof by visual observation of the collector electrode 1101 and by measuring solar cell characteristics by use of a solar simulator having the solar spectrum of AM 1.5 and the intensity of 100 mW/cm$^2$ to obtain photoelectric conversion efficiency.

As a result, it was verified that the curl amount of the slab was 0 mm, there were no defects of the collector electrode, and the photoelectric conversion efficiency was 9.5% and thus the thin film solar cell of the present example had good characteristics.

Example 2

The thin film solar cell was made in the manner similar to that of Example 1 except that the curl deformation eliminating step of (step 4) of Example 1 was carried out after the deposition of the semiconductor layers 804 to 812, the transparent conductor layer 813 was deposited thereafter, and then the slab was cut. The measurement of the curl amount was conducted twice, immediately after the correction of curl and after the cutting of slab.

As a result, it was found that the curl amount of the slab was 0 mm immediately after the correction of the curl and 1.5 mm after the cutting of slab, and therefore that the curl deformation occurred during deposition of the transparent conductor layer. It was also verified that there were no defects of the collector electrode in the thin film solar cell obtained and the photoelectric conversion efficiency thereof was 9.5%, which was the same result as in Example 1, and, therefore, the thin film solar cell of the present example had good characteristics.

Example 3

The thin film solar cell was made in the manner similar to that of Example 1 except that the curl deformation eliminating step of (step 4) of Example 1 was carried out after the deposition of the back surface reflecting layer 802, 803, the semiconductor layers 804 to 812 and the transparent conductor layer 813 were deposited thereafter, and then the slab was cut. The measurement of the curl amount was conducted twice, immediately after the correction of curl and after the cutting of slab.

As a result, it was found that the curl amount of the slab was 0 mm immediately after the correction of the curl and 4 mm after the cutting of slab, and therefore that the curl deformation occurred during deposition of the semiconductor layers 804 to 812 and the transparent conductor layer 813. It was also verified that there were no defects of the collector electrode in the thin film solar cell obtained and the photoelectric conversion efficiency thereof was 9.5%, which was the same result as in Example 1, and, therefore, the thin film solar cell of the present example had good characteristics.

Comparative Example

The thin film solar cell was made in the manner similar to that in Example 1 except that the curl deformation eliminating step of (step 4) of Example 1 was not carried out.

As a result, the curl amount of the slab reached 10 mm and many defects of the collector electrode were observed in a certain slab. A slab without defects of the collector electrode was selected and the photoelectric conversion efficiency thereof was measured. The efficiency measured was 9.5%, which was the same result as in Example 1.

The above results are summarized together in Table 2.

TABLE 2

|  | Curl amount (mm) | Appearance of collector electrode by visual observation | Photoelectric conversion efficiency (%) |
| --- | --- | --- | --- |
| Example 1 | 0 | good | 9.5 |
| Example 2 | 1.5 | good | 9.5 |
| Example 3 | 4 | good | 9.5 |
| Comparative Example | 10 | many defects | 9.5 |

As described above, according to the process of forming a deposited film of the present invention, particularly when applied to production of the photovoltaic element, it becomes possible to eliminate the curl deformation without a lowering of the photoelectric conversion efficiency, so that the flaws and defects of the electrode resulting from the curl deformation can be prevented and the appearance and the production yield of the photovoltaic element or the like can be improved.

What is claimed is:

1. A process of forming a deposited film on a belt-like substrate by a roll-to-roll system, the process comprising the step of eliminating a curl deformation of the belt-like substrate resulting from application of a deformation stress, by exerting only an external stress on a non-deposition surface of the belt-like substrate.

2. The process according to claim 1, wherein the belt-like substrate is an electrically conductive substrate.

3. The process according to claim 1, wherein the external stress is a deformation stress to effect plastic deformation of the belt-like substrate.

4. The process according to claim 1, wherein the deformation stress is a thermal deformation stress generated during formation of the deposited film on the belt-like substrate.

5. The process according to claim 1, wherein the deformation stress is a membrane stress of the deposited film formed on the belt-like substrate.

6. The process according to claim 1, wherein the external stress is exerted by use of a curl corrector.

7. The process according to claim 6, wherein the curl corrector is a cylindrical roller type curl corrector.

8. The process according to claim 1, further comprising the step of forming at least a semiconductor layer on the belt-like substrate.

9. The process according to claim 8, wherein the external stress is exerted after formation of the semiconductor layer.

10. The process according to claim 1, further comprising the step of forming at least a transparent conductor layer on the belt-like substrate.

11. The process according to claim 10, wherein the external stress is exerted after formation of the transparent conductor layer.

12. A process of producing a semiconductor element substrate, comprising the step of depositing at least a semiconductor layer on a belt-like substrate by a roll-to-roll system, the process further comprising the step of eliminating a curl deformation of the beltlike substrate resulting from application of a deformation stress, by exerting only an external stress on a non-deposition surface of the belt-like substrate.

13. The process according to claim 12, wherein the belt-like substrate is an electrically conductive substrate.

14. The process according to claim 12, wherein the external stress is a deformation stress to effect plastic deformation of the belt-like substrate.

15. The process according to claim 12, wherein the deformation stress is a thermal deformation stress generated during deposition of the semiconductor layer on the belt-like substrate.

16. The process according to claim 12, wherein the deformation stress is a membrane stress of the semiconductor layer deposited on the belt-like substrate.

17. The process according to claim 12, wherein the external stress is exerted by use of a curl corrector.

18. The process according to claim 17, wherein the curl corrector is a cylindrical roller type curl corrector.

19. The process according to claim 12, wherein the external stress is exerted after deposition of the semiconductor layer.

20. The process according to claim 12, further comprising the step of forming at least a transparent conductor layer on the belt-like substrate.

21. The process according to claim 20, wherein the external stress is exerted after formation of the transparent conductor layer.

22. A process of producing a photovoltaic element, comprising the step of depositing at least a semiconductor layer and a transparent conductor layer on a belt-like substrate by a roll-to-roll system, the process further comprising the step of eliminating a curl deformation of the belt-like substrate resulting from application of a deformation stress, by exerting only an external stress on a non-deposition surface of the belt-like substrate.

23. The process according to claim 22, wherein the belt-like substrate is an electrically conductive substrate.

24. The process according to claim 22, wherein the external stress is a deformation stress to effect plastic deformation of the belt-like substrate.

25. The process according to claim 22, wherein the deformation stress is a thermal deformation stress generated during deposition of the semiconductor layer and/or the transparent conductor layer on the belt-like substrate.

26. The process according to claim 22, wherein the deformation stress is a membrane stress of the semiconductor layer and/or the transparent conductor layer deposited on the belt-like substrate.

27. The process according to claim 22, wherein the external stress is exerted by use of a curl corrector.

28. The process according to claim 27, wherein the curl corrector is a cylindrical roller type curl corrector.

29. The process according to claim 22, wherein the external stress is exerted after deposition of the semiconductor layer.

30. The process according to claim 22, wherein the external stress is exerted after deposition of the transparent conductor layer.

31. The process according to claim 22, further comprising the step of forming at least a back surface reflecting layer on the belt-like substrate.

32. The process according to claim 31, wherein the external stress is exerted after formation of the back surface reflecting layer.

* * * * *

UNITED STATES PATENT AND TRADEMARK OFFICE
CERTIFICATE OF CORRECTION

PATENT NO.    : 6,362,020 B1                                              Page 1 of 1
DATED         : March 26, 2002
INVENTOR(S)   : Hiroshi Shimoda et al.

It is certified that error appears in the above-identified patent and that said Letters Patent is hereby corrected as shown below:

Column 1,
Line 45, "convenience-sake." should read -- convenience' sake. --.

Column 8,
Line 47, "forty two" should read -- forty-two --.

Column 10,
Lines 9 and 43, "only" should be deleted;
Lines 9 and 44, "on a" should read -- only onto the --; and
Line 42, "beltlike" should read -- belt-like --.

Column 11,
Line 10, "only" should be deleted; and
"on a" should read -- only onto the --.

Signed and Sealed this

Second Day of September, 2003

JAMES E. ROGAN
*Director of the United States Patent and Trademark Office*